(12) United States Patent
Fu et al.

(10) Patent No.: US 12,116,690 B2
(45) Date of Patent: Oct. 15, 2024

(54) PROCESS FOR SYNTHESIZING INDIUM PHOSPHIDE BY LIQUID PHOSPHORUS INJECTION METHOD

(71) Applicant: THE 13TH RESEARCH INSTITUTE OF CHINA ELECTRONICS TECHNOLOGY GROUP CORPORATION, Hebei (CN)

(72) Inventors: Lijie Fu, Hebei (CN); Niefeng Sun, Hebei (CN); Shujie Wang, Hebei (CN); Xiaolan Li, Hebei (CN); Xin Zhang, Hebei (CN); Xiaodan Zhang, Hebei (CN); Yanlei Shi, Hebei (CN); Huimin Shao, Hebei (CN); Yang Wang, Hebei (CN)

(73) Assignee: THE 13TH RESEARCH INSTITUTE OF CHINA ELECTRONICS TECHNOLOGY GROUP CORPORATION, Hebei (CN)

( * ) Notice: Subject to any disclaimer, the term of this patent is extended or adjusted under 35 U.S.C. 154(b) by 105 days.

(21) Appl. No.: 17/797,073

(22) PCT Filed: Sep. 10, 2020

(86) PCT No.: PCT/CN2020/114332
§ 371 (c)(1),
(2) Date: Aug. 2, 2022

(87) PCT Pub. No.: WO2021/243873
PCT Pub. Date: Dec. 9, 2021

(65) Prior Publication Data
US 2023/0055938 A1    Feb. 23, 2023

(30) Foreign Application Priority Data

Jun. 2, 2020 (CN) .......................... 202010487276.2

(51) Int. Cl.
*C30B 15/02* (2006.01)
*C30B 15/00* (2006.01)
*C30B 29/40* (2006.01)

(52) U.S. Cl.
CPC ............ *C30B 15/02* (2013.01); *C30B 15/002* (2013.01); *C30B 29/40* (2013.01)

(58) Field of Classification Search
CPC ........ C30B 15/02; C30B 15/002; C30B 29/40
See application file for complete search history.

(56) References Cited

U.S. PATENT DOCUMENTS 3,899,572 A * 8/1975 Watanabe ............... C01B 25/06
423/299

FOREIGN PATENT DOCUMENTS

| CN | 102965734 | * | 3/2013 | |
| CN | 206204481 U | * | 5/2017 | |
| CN | 212895088 U | * | 4/2021 | ........... C30B 15/002 |

OTHER PUBLICATIONS

New Direct Synthesis Technique for Indium Phosphide Using Liquid Phosphorus T. Inada et al Journal of Crystal Growth 82 1987 pp. 561-565.*

* cited by examiner

*Primary Examiner* — Robert M Kunemund
(74) *Attorney, Agent, or Firm* — Enable IP, P.C.

(57) ABSTRACT

The present invention relates to a process for synthesizing indium phosphide by liquid phosphorus injection method, which belongs to the field of semiconductor technology. The method comprises: converting gaseous phosphorus into liquid phosphorus through a condenser, injecting the liquid phosphorus into an indium melt while preventing phosphorus vaporization by randomly delivering a low temperature inert gas, and causing an instantaneous reaction between the liquid phosphorus and the liquid indium melt, so that an (Continued)

indium phosphide melt can be synthesized at a relatively low temperature, with advantages of high efficiency, high purity, precise proportioning, large capacity, aiding in the growth of a phosphorus-rich indium phosphide polycrystal and facilitating the growth of an indium phosphide monocrystal. The method includes the steps of indium cleaning, phosphorus charging, furnace loading, communication of condenser, synthesis, preparation of crystals, etc.

9 Claims, 1 Drawing Sheet

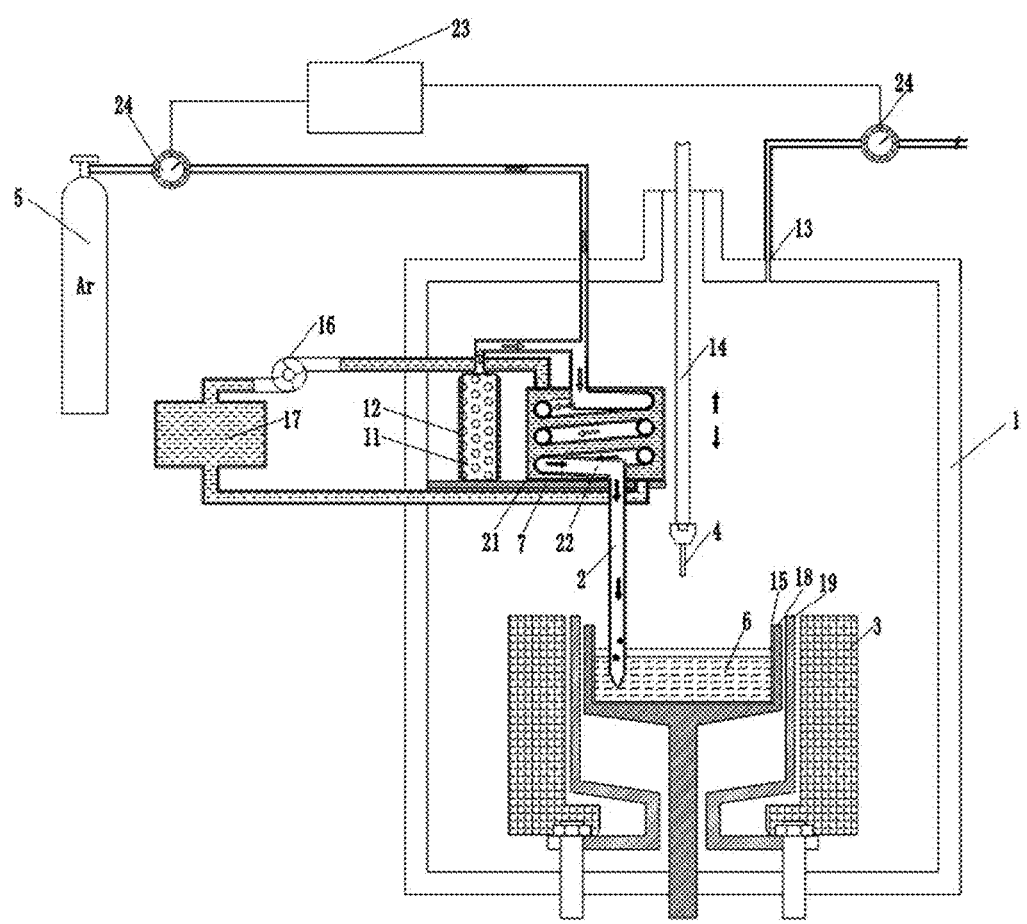

PROCESS FOR SYNTHESIZING INDIUM PHOSPHIDE BY LIQUID PHOSPHORUS INJECTION METHOD

TECHNICAL FIELD

The present invention belongs to the field of semiconductor technology, which involves the preparation of indium phosphide, and specifically involves a process for synthesizing indium phosphide using liquid phosphorus and liquid indium.

BACKGROUND ART

Indium phosphide (InP) is a Groups III-V compound semiconductor material composed of Group III element indium (In) and Group V element phosphorus (P), which has a very important strategic position in the field of semiconductor materials. It is an irreplaceable semiconductor material for optoelectronic devices and microelectronic devices at present. InP has many advantages over germanium and silicon materials: high electro-optic conversion efficiency due to the direct transition energy band structure; high electron mobility, easy to make semi-insulating materials, and suitable for making high-frequency microwave devices and circuits; high operating temperature; strong radiation resistance; high conversion efficiency as a solar cell material. Therefore, InP and other materials are widely used in high-tech fields such as solid-state lighting, microwave communication, optical fiber communication, microwave and millimeter wave devices, and anti-radiation solar cells.

With the development of energy band engineering theory, ultra-thin material technology and deep submicron fabrication technology, InP has increasingly showing its advantages in high-end microwave, millimeter-wave electronic devices and optoelectronic devices. InP has become the first choice for high-end millimeter-wave devices, and has been widely valued. The development and application prospects are very broad. The realization of high-end InP-based microelectronic and optoelectronic devices depends on the preparation of high-quality InP monocrystals with good integrity, homogeneity and thermal stability, especially the preparation of the large-diameter high-pressure liquid encapsulation Czochralski (HP-LEC) InP monocrystals. High purity, different melt proportion and inclusion-free InP polycrystalline materials are the prerequisites for producing high-quality InP and studying the related characteristics of InP. Many properties of InP crystals are related to the properties of the starting materials, i.e. the polycrystalline materials, such as the proportionality of the polycrystalline materials, the purity of the material. The properties of polycrystalline materials have a great impact on crystal growth, electrical performance of crystals, crystal integrity, homogeneity, etc. Therefore, the rapid and large-capacity synthesis of InP melt is a very concerned issue in the field of InP research.

At present, several commonly used methods for synthesizing InP polycrystalline materials and the problems thereof are as follows: (1) horizontal Bridgman method (HB) and horizontal gradient coagulation method (HGF): the horizontal Bridgman method (HB) and horizontal gradient solidification method (HGF) can be used to synthesize InP materials. In terms of process, the larger the amount of synthesis, the longer the synthesis time. Generally, it takes about 24 h to synthesize 1.5 Kg InP polycrystalline by means of the HB/HGF technology. Therefore, the contamination of Si is more obvious (the source is quartz tube wall). The carrier concentration of commercially available InP polycrystals is as low as $6 \times 10^{15}$ cm$^{-3}$, which has a negative impact on the fabrication of high performance microelectronic and optoelectronic devices, and the possibility of "tube burst" is high. No matter what form of synthetic boats, it is very difficult to increase the weight of In. In addition, increasing the diameter of the quartz tube is bound to require a high-pressure kettle with larger caliber, and the cost will also increase rapidly.

(2) Phosphorus injection synthesis technique: the phosphorus injection synthesis technology is to inject vaporized phosphorus vapor into an indium melt to synthesize an indium phosphide melt. Because this method relies on the internal and external pressure difference of the quartz phosphorus container to inject the phosphorus vapor, once the pressure difference is not controlled properly, bubble burst is prone to occur. Some phosphorus vapor is not absorbed by the melt, on the one hand, it affects the synthesis effect. On the other hand, the phosphorus vapor from the losses is volatilized to the furnace body, which brings great trouble to cleaning the furnace body. In the above-mentioned synthetic methods, such as horizontal Bridgman method (HB), horizontal gradient solidification method (HGF) and ultra-high pressure direct synthesis technology, InP synthesis is firstly performed in a synthesis furnace; then the synthesized InP polycrystalline material is taken out of the synthesis furnace, and subjected to cleaning and corrosion treatment; and the treated InP polycrystalline material is loaded into a high-pressure monocrystal furnace for InP monocrystal growth. Synthesis and crystal growth are performed using a "two-step" process, which greatly increases the likelihood of contamination of the material and increases the cost of material preparation.

SUMMARY OF THE INVENTION

It is an object of the present invention is to provide a fast and efficient process for synthesizing an indium phosphide polycrystalline material with high-purity. In this process, the vaporized phosphorus vapor is liquefied to participate in the reaction to realize the instantaneous reaction between the liquid phosphorus and the liquid indium melt, so that the synthesis can be carried out with high efficiency and high purity, facilitating crystal growth.

The technical solution of the present invention is a process for synthesizing indium phosphide based on a synthesis system comprising a quartz phosphorus bubble, a condenser, a phosphorus source furnace, a lifting crucible, a low temperature inert gas random delivery system and a monocrystal furnace, the method comprises the following steps:

1) indium cleaning: performing a surface cleaning treatment on indium, and drying the cleaned indium for later use;

2) phosphorus charging: charging red phosphorus into the quartz phosphorus bubble under the protection of a nitrogen atmosphere;

3) furnace loading: placing the quartz phosphorus bubble into the phosphorus source furnace for heating; then loading the phosphorus source furnace equipped with the quartz phosphorus bubble, the condenser, a seed crystal, the crucible filled with indium and a mated graphite support, an insulation jacket and a heater into a hearth of the monocrystal furnace, and placing a boron oxide protective agent;

4) communication of condenser: communicating an inlet of the condenser with the low temperature inert gas random delivery system and a mouth of the quartz phosphorus bubble, and checking whether there is air leakage;

5) synthesis:

A, closing a furnace door, vacuuming the furnace, randomly delivering a low temperature inert gas by the low temperature inert gas random delivery system into the furnace through the condenser, and maintaining the pressure in the furnace greater than the dissociation pressure of indium phosphide;

B, heating the indium in the crucible until the indium melts,

C, lifting the crucible to allow an outlet end of the condenser to inserted into the indium melt, and introducing a circulating cooling liquid into the condenser; and D, vaporizing the phosphorus in the quartz phosphorus bubble by heating the phosphorus source furnace, condensing the vaporized phosphorus vapor into liquid white phosphorus through the condenser, and flowing the liquid white phosphorus into the indium melt to react and synthesize a proportioned indium phosphide; and 6) preparation of crystals: after the phosphorus in the quartz phosphorus bubble is completely vaporized and injected into the indium melt, lowering the crucible away from the outlet of the condenser, and then lowering the seed crystal to perform a high-pressure liquid encapsulation Czochralski (HP-LEC) crystal growth.

Furthermore, in order to improve the purity of the indium phosphide melt and ensure the proportion precision, the indium cleaning in step 1) comprises removing oxides and residual impurities on the indium surface, wherein after cleaning, the indium reaches a purity of 6N, and has no dust impurities on the surface.

Furthermore, in order to improve the purity of the indium phosphide melt and ensure the proportion precision, the purity of phosphorus in step 2) is 6N.

Further, in order to ensure the pressure in the furnace, the vacuum degree in the phosphorus source furnace in step 5) is 30-100 Pa.

Further, the temperature of the low temperature inert gas in step 5) is lower than 156° C. in order to facilitate the liquefaction of phosphorus and to avoid gasification of the liquid phosphorus injection process to achieve the instantaneous reaction of liquid phosphorus with the liquid indium melt.

Further, the low temperature inert gas in step 5), nitrogen or argon of 2 MPa is filled in the low temperature inert gas random delivery system. The random delivery of the low temperature inert gas can ensure that the liquefied white phosphorus is not vaporized during the process of injecting the indium melt. In step 5), the condenser is connected to one end of the quartz phosphorus bubble and is also connected to an external argon cylinder. The vaporized phosphorus vapor enters the condenser together with the argon, and the liquefied phosphorus is injected into the indium melt together with the argon. On the one hand, the argon can continuously reduce the temperature of the liquid white phosphorus; on the other hand, the argon can bring the liquid white phosphorus to flow down to ensure that the liquefied white phosphorus is not vaporized during the descending process.

Further, the heating power of the phosphorus source furnace in step 5) is increased from 0 W to 3000 W within 2 hours, and phosphorus is gradually vaporized by 770 K. Red phosphorus and white phosphorus are allotropes of phosphorus (P). For safety reasons, red phosphorus is the most commonly used one in the synthesis of indium phosphide. The red phosphorus in the phosphorus bubble vaporizes to phosphorus vapor, and the vaporized phosphorus condenses into liquid white phosphorus at a low temperature through the condenser. The temperature in the quartz phosphorus bubble is raised to 770 K. The red phosphorus can be sublimated into a gas when heated to above 416° C. (sublimation temperature). When it is cooled and condensed at a lower temperature (below 300° C.), the gas will can continue to be supercooled and become liquid white phosphorus.

Further, in order to ensure that the liquid phosphorus reacts instantaneously with the liquid indium melt, the temperature in the crucible in step 5) is 1300-1400 K.

Further, the condensing medium in the condenser is gallium indium alloy. Ga—In alloy has stable properties, low melting point, good fluidity and low shrinkage, which can ensure the condensation of vaporized phosphorus. Other materials having good thermal conductivity and flowability that are liquid above 20° C. and substantially non-vaporized below 500° C. may also be used as the condensing medium.

Further, the low temperature inert gas random delivery system includes a differential pressure controller that controls the pressure. The differential pressure controller can prevent suck-back and bubble burst caused by the imbalance of internal and external differential pressures.

Advantageous effects of the present invention are: 1. the process comprises: converting gaseous phosphorus into liquid phosphorus, injecting the liquid phosphorus into an indium melt, and causing an instantaneous reaction between the liquid phosphorus and the liquid indium melt, so that an indium phosphide melt can be synthesized at a relatively low temperature, with advantages of high efficiency, high purity, precise proportioning, large capacity, aiding in the growth of a phosphorus-rich indium phosphide polycrystal and facilitating the growth of an indium phosphide monocrystal. 2. The problems of suck-back and bubble burst during indium phosphide synthesis can be solved, reducing high-temperature contamination, and improving material purity. 3. Liquid phosphorus is used to participate in the reaction, greatly reducing the volatilization amount of phosphorus and saving the cost of raw materials to a certain extent. By the use of in-situ synthesis technology, crystal growth can be continuous after synthesis, thereby reducing the risk of material contamination, saving the cost of materials and simplifying the operation. 4. The liquid-liquid reaction, as an instantaneous reaction, can solve the problem that indium phosphide is difficult to proportion, and synthesize high-quality indium phosphide proportioned in a short time. 5. The crystals grown by the high-pressure liquid encapsulation Czochralski method have good integrity, homogeneity and thermal stability. High-quality monocrystals, especially large-diameter monocrystals, can be prepared. It is beneficial to prepare polycrystalline InP with high purity, different melt proportions and no inclusion.

BRIEF DESCRIPTION OF THE DRAWINGS

FIG. 1 is a schematic view showing a structure of a system for synthesizing indium phosphide by liquid phosphorus injection method in an example. In the drawings, 1, monocrystal furnace; 11, quartz phosphorus bubble; 12, phosphorus source furnace; 13, gas outlet; 14, seed rod; 15, crucible; 16, cooling liquid pump; 17, cooling liquid tank; 18, graphite support; 19, heater; 2, outlet; 21, cooling box; 22, spiral pipe; 23, differential pressure controller; 24, pressure gauge;

3, insulation jacket; 4, seed crystal; 5, gas cylinder; 6, indium melt; and 7, supporting plate.

DETAILED DESCRIPTION OF THE INVENTION

Hereinafter, the present invention will be described in detail with reference to the accompanying drawings and examples.

A process for synthesizing indium phosphide by liquid phosphorus injection method. The method is based on a system for synthesizing indium phosphide by liquid phosphorus injection method. The system comprises an InP monocrystal furnace 1 based on an in-situ synthesis method. The monocrystal furnace 1 comprises a vacuum system, a gas charging and discharging system, a temperature and pressure control system, an electrical control system, a cooling circulation system, a weighing system, a pulling and lifting mechanism for a seed rod 14, a crucible 15 and heating, insulation and elevating mechanisms mated with the crucible 15. The crucible 15 is located on a graphite support 18. A heater 19 is arranged on the periphery of the graphite support 18. The periphery of the heater 19 is provided with an insulation jacket 3. A bottom end of the graphite support 18 extends beyond a bottom of the furnace and is connected to a crucible rod rotating and lifting mechanism. The crucible rod rotating and lifting mechanism is a common basic mechanism for a monocrystal furnace and a synthesis furnace in the art which is configured to drive the crucible to lift and rotate, so that indium and phosphorus are uniformly mixed and fully reacted, and will not be described in detail herein. The seed rod 14 is provided above the crucible 15. The seed crystal 4 and a weighing sensor are fixed on the seed rod 14. The seed rod 14 passes out of a furnace cover and is connected to the seed rod lifting mechanism. The seed rod lifting mechanism may lift the seed crystal 4 to pull the growing crystal. The weighing sensor and the weighing system can calculate the weight of crystal growth. The seed rod 14, the weighing sensor and the weighing system, and the seed rod lifting mechanism are all common basic mechanisms of the monocrystal furnace for pulling the growing crystals, and will not be described in detail herein.

The monocrystal furnace 1 is improved by providing a condenser in the monocrystal furnace 1. The condenser comprises a cooling box 21 filled with a cooling liquid and a spiral pipe 22 immersed in the cooling liquid. An inlet of the spiral pipe 22 communicates with a mouth of the quartz phosphorus bubble 11, and an outlet 2 of the spiral pipe 22 is inserted into the indium melt 6 in the crucible 15. The quartz phosphorus bubble 11 is provided in the phosphorus source furnace 12. The phosphorus source furnace 12 and the cooling box 21 are provided on a supporting plate 7. The supporting plate 7 is attached to a furnace wall of the monocrystal furnace 1. The seed rod 14 is located at a side of the supporting plate 7. The cooling box 21 is connected to a cooling liquid pump 16 and a cooling liquid tank 17 outside the monocrystal furnace 1 by means of piping. The cooling liquid is a gallium indium alloy. The cooling box 21 is made of stainless steel. The low temperature inert gas random delivery system comprises a gas cylinder 5, a gas outlet 13, a pressure gauge 24, a differential pressure controller 23 and mated pipelines. The inlet of the spiral pipe 22 also communicates with the gas cylinder 5 provided outside the monocrystal furnace 1. The gas cylinder 5 is filled with an inert gas. The inert gas is argon at a temperature below 156° C. A pressure gauge 24 and a differential pressure controller 23 are provided in the connection pipeline between the gas cylinder 5 outside the monocrystal furnace 1 and the spiral pipe 22. The gas outlet 13 is provided at the top of the monocrystal furnace 1. The inert gas flows along the spiral pipe 22 into the indium melt 6 in the crucible 15, and flows out from the gas outlet 13.

The method comprises the steps of:
1) the indium cleaning: removing oxides and residual impurities on the indium surface, wherein after cleaning, the indium reaches a purity of 6N, and has no dust impurities on the surface; and drying the cleaned indium for later use.
2) phosphorus charging: charging red phosphorus into the quartz phosphorus bubble 11 under the protection of a nitrogen atmosphere.
3) furnace loading: placing the quartz phosphorus bubble 11 into the phosphorus source furnace 12 for heating; then loading the phosphorus source furnace 12 equipped with the quartz phosphorus bubble 11, the condenser, the seed crystal 4, the crucible 15 filled with indium and the mated graphite support 18, the insulation jacket 3 and the heater 19 into a hearth of the monocrystal furnace 1, and placing a boron oxide protective agent;
4) communication of condenser: communicating the inlet of the spiral pipe 22 with the gas cylinder 5 and the mouth of the quartz phosphorus bubble 11, and checking whether there is air leakage;
5) synthesis:
A, closing a furnace door, vacuuming the furnace, after the degree of vacuum reaches 60 Pa, stopping vacuuming, and filling high-purity argon of 2 MPa;
B, heating the indium in the crucible 15 to 1373K,
C, lifting the crucible 15, inserting the outlet 2 of the spiral pipe 22 into the indium melt, and introducing a circulating cooling liquid into the cooling box 21;
D. slowly increasing the heating power of the phosphorus source furnace 12 from 0 W to 3000 W, and gradually vaporizing solid phosphorus at 770 K; condensing the vaporized phosphorus into liquid white phosphorus through the condenser at a low temperature; and injecting the liquid white phosphorus into the crucible 15 under the double forces of gravity and argon to react with the indium melt to synthesize a proportioned indium phosphide.
6) preparation of crystals: after the phosphorus in the quartz phosphorus bubble 11 is completely vaporized and injected into the indium melt, lowering the crucible 15 away from the outlet of the condenser 2, and then lowering the seed crystal 4 to perform the high-pressure liquid encapsulation Czochralski (HP-LEC) crystal growth.

The invention claimed is:
1. A process for synthesizing indium phosphide by liquid phosphorus injection method based on a synthesis system comprising a quartz phosphorus bubble, a condenser, a phosphorus source furnace, a lifting crucible, a low temperature inert gas random delivery system and a monocrystal furnace, characterized in that the method comprises the following steps:
1) Indium cleaning: performing a surface cleaning treatment on indium, and drying the cleaned indium for later use;
2) Phosphorus charging: charging red phosphorus into the quartz phosphorus bubble under the protection of a nitrogen atmosphere;

3) Furnace loading: placing the quartz phosphorus bubble into the phosphorus source furnace for heating; then loading the phosphorus source furnace equipped with the quartz phosphorus bubble, the condenser, a seed crystal, the crucible filled with indium and a mated graphite support, an insulation jacket and a heater into a hearth of the monocrystal furnace, and placing a boron oxide protective agent;

4) Communication of condenser: communicating an inlet of the condenser with the low temperature inert gas random delivery system and a mouth of the quartz phosphorus bubble, and checking whether there is air leakage;

5) Synthesis:

A, closing a furnace door, vacuuming the furnace, randomly delivering a low temperature inert gas by the low temperature inert gas random delivery system into the furnace through the condenser, and maintaining the pressure in the furnace greater than the dissociation pressure of indium phosphide;

B, heating the indium in the crucible until the indium melts,

C, lifting the crucible to allow an outlet end of the condenser to inserted into the indium melt, and introducing a circulating cooling liquid into the condenser; and D, vaporizing the phosphorus in the quartz phosphorus bubble by heating the phosphorus source furnace, condensing the vaporized phosphorus vapor into liquid white phosphorus through the condenser, and flowing the liquid white phosphorus into the indium melt to react and synthesize a proportioned indium phosphide; and 6) Preparation of crystals: after the phosphorus in the quartz phosphorus bubble is completely vaporized and injected into the indium melt, lowering the crucible away from the outlet of the condenser, and then lowering the seed crystal to perform a high-pressure liquid encapsulation Czochralski (HP-LEC) crystal growth;

wherein a condensing medium in the condenser is a gallium indium alloy.

2. The process for synthesizing indium phosphide by liquid phosphorus injection method according to claim 1, characterized in that: the indium cleaning in step 1) comprises removing oxides and residual impurities on the indium surface, wherein after cleaning, the indium reaches a purity of 6N, and has no dust impurities on the surface.

3. The process for synthesizing indium phosphide by liquid phosphorus injection method according to claim 1, characterized in that, the purity of phosphorus in step 2) is 6N.

4. The process for synthesizing indium phosphide by liquid phosphorus injection method according to claim 1, characterized in that, the degree of vacuum in the phosphorus source furnace in step 5) is 30-100 Pa.

5. The process for synthesizing indium phosphide by liquid phosphorus injection method according to claim 4, characterized in that: the temperature of the low temperature inert gas in step 5) is less than 156° C.

6. The method for synthesizing indium phosphide by liquid phosphorus injection according to claim 5, characterized in that, nitrogen or argon of 2 MPa is filled in the low temperature inert gas random delivery system.

7. The process for synthesizing indium phosphide by liquid phosphorus injection method according to claim 1, characterized in that, the heating power of the phosphorus source furnace in step 5) is increased from 0 W to 3000 W within 2 hours, and phosphorus is gradually vaporized by 770 K.

8. The process for synthesizing indium phosphide by liquid phosphorus injection method according to claim 1, characterized in that, the temperature in the crucible in step 5) is 1300-1400 K.

9. The process for synthesizing indium phosphide by liquid phosphorus injection method according to claim 1, characterized in that, the low temperature inert gas random delivery system includes a differential pressure controller that controls the pressure.

* * * * *